(12) United States Patent
Ifis et al.

(10) Patent No.: US 12,219,701 B2
(45) Date of Patent: Feb. 4, 2025

(54) COMPONENT CARRIER

(71) Applicant: AT&S Austria Technologie & Systemtechnik Aktiengesellschaft, Leoben (AT)

(72) Inventors: Abderrazzaq Ifis, Leoben (AT); Reinhard Opitz, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 127 days.

(21) Appl. No.: 17/660,168

(22) Filed: Apr. 21, 2022

(65) Prior Publication Data

US 2022/0346229 A1    Oct. 27, 2022

(30) Foreign Application Priority Data

Apr. 23, 2021 (EP) .................................... 21170109

(51) Int. Cl.
*H05K 1/03* (2006.01)
*H05K 1/02* (2006.01)
(Continued)

(52) U.S. Cl.
CPC ......... *H05K 1/0353* (2013.01); *H05K 1/0298* (2013.01); *H05K 3/4673* (2013.01)

(58) Field of Classification Search
CPC .. H05K 1/0353; H05K 1/0298; H05K 3/4673; H05K 2201/0195;
(Continued)

(56) References Cited

U.S. PATENT DOCUMENTS 9,961,768 B2 * 5/2018 Otsubo ............... H01L 21/4867
2002/0000901 A1 1/2002 Kuhara et al.
(Continued)

FOREIGN PATENT DOCUMENTS

CN 201374874 Y 12/2009
CN 104080281 A 10/2014
(Continued)

OTHER PUBLICATIONS

Castagné, O.; Extended European Search Report in Application No. 21170109.9; pp. 1-8; Oct. 8, 2021; European Patent Office; 80298, Munich, Germany.
(Continued)

*Primary Examiner* — Timothy J Thompson
*Assistant Examiner* — Amol H Patel
(74) *Attorney, Agent, or Firm* — Robert A. Blaha; Smith Tempel Blaha LLC

(57) ABSTRACT

A component carrier includes (a) a base structure having a surface with a surface profile; (b) a first dielectric layer formed on the surface of the base structure and (c) a second dielectric layer formed on the first dielectric layer. The first dielectric layer has a first main surface with a first surface profile. The first main surface faces away from the surface of the base structure. The first surface profile corresponds to the surface profile of the base structure. The second dielectric layer includes a second main surface with a second surface profile. The second main surface faces away from the surface of the base structure. The second surface profile differs from the surface profile of the base structure. A manufacturing method uses an auxiliary sheet for pressing the first dielectric layer on the main surface. The auxiliary sheet is removed before pressing the second dielectric layer.

17 Claims, 2 Drawing Sheets

(51) Int. Cl.
*H05K 1/11* (2006.01)
*H05K 1/18* (2006.01)
*H05K 3/00* (2006.01)
*H05K 3/46* (2006.01)

(58) Field of Classification Search
CPC ......... H05K 2201/09136; H05K 1/116; H05K 1/02; H05K 1/03; H05K 1/11; H05K 1/185; H05K 3/00
See application file for complete search history.

(56) References Cited

U.S. PATENT DOCUMENTS

| | | | |
|---|---|---|---|
| 2002/0034619 A1 | 3/2002 | Yamada et al. | |
| 2004/0188135 A1 | 9/2004 | Brodsky et al. | |
| 2004/0231151 A1* | 11/2004 | Nakatani | H05K 3/4614 29/829 |
| 2005/0135072 A1 | 6/2005 | Xu et al. | |
| 2008/0070011 A1 | 3/2008 | Oh et al. | |
| 2009/0032285 A1 | 2/2009 | Ueda et al. | |
| 2009/0308639 A1 | 12/2009 | Chung | |
| 2011/0100523 A1 | 5/2011 | Shindo et al. | |
| 2013/0207848 A1 | 8/2013 | Epp et al. | |
| 2014/0338963 A1 | 11/2014 | Huang | |
| 2014/0363646 A1 | 12/2014 | Hayashi et al. | |
| 2015/0245494 A1 | 8/2015 | Araki et al. | |
| 2016/0204494 A1 | 7/2016 | Pykäri et al. | |
| 2017/0290148 A1 | 10/2017 | Ohkoshi et al. | |
| 2017/0318670 A1 | 11/2017 | Tachibana et al. | |
| 2018/0063960 A1 | 3/2018 | Sasaki et al. | |
| 2018/0139854 A1 | 5/2018 | Chen et al. | |
| 2018/0206337 A1 | 7/2018 | Hanao et al. | |
| 2018/0332721 A1 | 11/2018 | Shimizu et al. | |
| 2019/0110364 A1 | 4/2019 | Yoneda | |
| 2019/0148273 A1 | 5/2019 | Hu | |
| 2019/0159347 A1 | 5/2019 | Ito et al. | |
| 2019/0269010 A1* | 8/2019 | Araki | H05K 3/28 |
| 2020/0058569 A1 | 2/2020 | Cho et al. | |
| 2022/0217841 A1* | 7/2022 | Kuo | H05K 3/465 |

FOREIGN PATENT DOCUMENTS

| | | |
|---|---|---|
| CN | 104476902 A | 4/2015 |
| CN | 105491800 A | 4/2016 |
| CN | 106413263 A | 2/2017 |
| CN | 106852031 A | 6/2017 |
| CN | 106961801 A | 7/2017 |
| CN | 107231764 A | 10/2017 |
| CN | 104470267 B | 12/2017 |
| CN | 105163526 B | 12/2017 |
| CN | 107592735 A | 1/2018 |
| CN | 107718840 A | 2/2018 |
| CN | 107949190 A | 4/2018 |
| CN | 108200736 A | 6/2018 |
| CN | 108601213 A | 9/2018 |
| CN | 109637981 A | 4/2019 |
| CN | 106063391 B | 6/2019 |
| CN | 109905982 A | 6/2019 |
| CN | 110493980 A | 11/2019 |
| CN | 110896590 A | 3/2020 |
| CN | 111066377 A | 4/2020 |
| EP | 0742265 A1 | 11/1996 |
| EP | 1507448 A1 | 2/2005 |
| EP | 1419528 B1 | 10/2006 |
| EP | 1981314 A1 | 10/2008 |
| EP | 1997115 B1 | 10/2011 |
| EP | 2936513 B1 | 2/2017 |
| EP | 1482771 B1 | 11/2018 |
| GB | 2494946 B | 10/2013 |
| IN | 110493978 A | 11/2019 |
| JP | H07336001 A | 12/1995 |
| JP | H1197843 A | 4/1999 |
| JP | H11186723 A | 7/1999 |
| JP | 2000269695 A | 9/2000 |
| JP | 2001007481 A | 1/2001 |
| JP | 2003258424 A | 9/2003 |
| JP | 2007012852 A | 1/2007 |
| JP | 2007324439 A | 12/2007 |
| JP | 2008307886 A | 12/2008 |
| JP | 2010161402 A | 7/2010 |
| JP | 2013018119 A | 1/2013 |
| JP | 2013098325 A | 5/2013 |
| JP | 2013222899 A | 10/2013 |
| JP | 2014130926 A | 7/2014 |
| JP | 2018190971 A | 11/2018 |
| KR | 20090103605 A | 10/2009 |
| TW | 677271 B | 11/2019 |
| WO | 2012020818 A1 | 2/2012 |
| WO | 2019184785 A1 | 10/2019 |

OTHER PUBLICATIONS

Anonymous; PatBase—Search Results; pp. 1-49; Mar. 23, 2020; search terms as listed on p. 2 of 49 at the top of the page.
Anonymous; PatBase—Search Results—45 total; pp. 1-49; Mar. 23, 2020; search terms as listed on p. 2 of 49 at the top of the page.
Office Action in Application 202210459788.7; pp. 1-5; Sep. 12, 2024; China National Intellectual Property Administration; No. 6 Xitucheng Road, Haidian Diatrict, Beijing, P.R.China 100088.

* cited by examiner

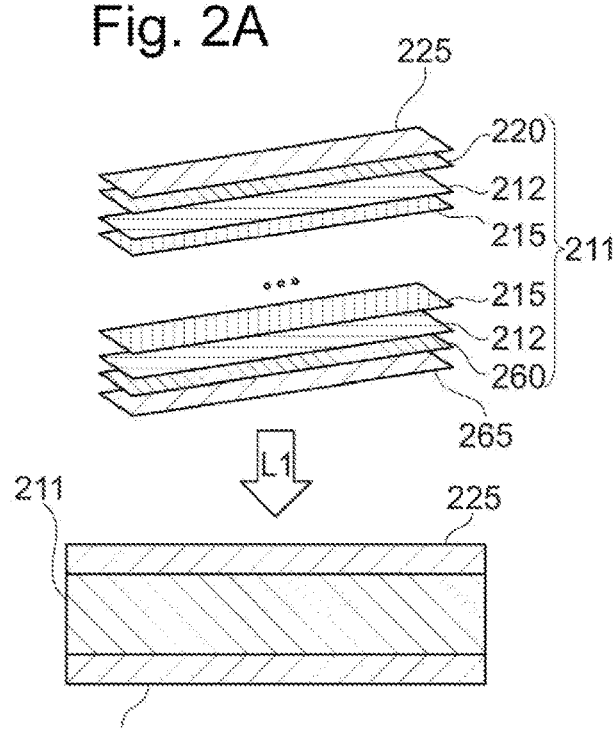
Fig. 2A
Fig. 2B
Fig. 2C
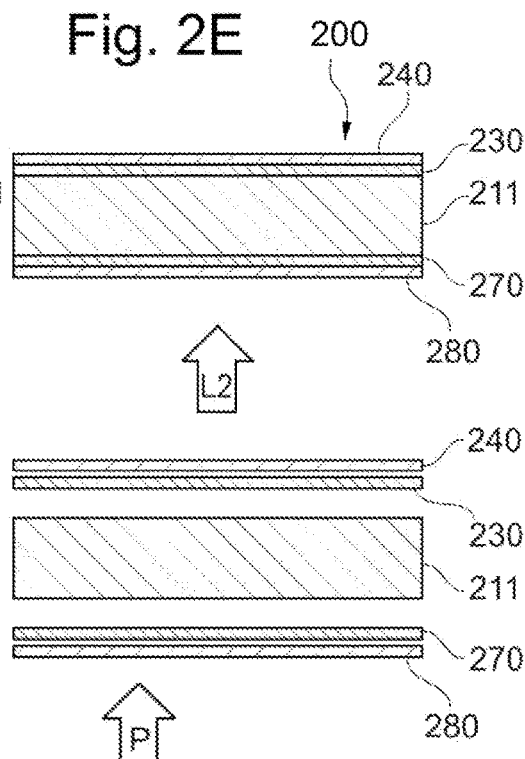
Fig. 2E
Fig. 2D

COMPONENT CARRIER

CROSS-REFERENCE TO RELATED APPLICATIONS

This application claims the benefit of the filing date of the European Patent Application No. 21170109.9, filed Apr. 23, 2021, the disclosure of which is hereby incorporated herein by reference.

TECHNICAL FIELD

Embodiments of the present invention relate to the technical field of component carriers onto which electronic components can be mounted in order to form an electronic assembly. In particular, the present invention relates to a component carrier and a method for manufacturing such a component carrier.

TECHNOLOGICAL BACKGROUND

A component carrier such as a Printed Circuit Board (PCB) is a support structure for at least one electronic component forming an electronic assembly respectively an electronic circuit. A component carrier comprises a stack of at least one electrically insulating or dielectric layer structure and at least one electrically conductive layer structure, typically made from a metal such as copper. Conductor traces representing an interconnecting wiring are formed by means of an appropriate structuring or patterning of the electrically conductive layer structure which is provided on top or beneath an electrically insulating layer of a component carrier. An electronic component may be mounted on an upper or lower surface of a component carrier. In some applications, an electronic component is embedded at least partially within (the volume of) a component carrier.

A multilayer component carrier is a laminated stack consisting of several (patterned) electrically conductive layer structures and several electrically insulating or dielectric layer structures in an alternating sequence. For electrically connecting different electrically conductive layer structures there may be used metallized vias extending at least through one electrically insulating layer.

A "thick" multilayer component carrier may comprise a layer count of e.g., thirty-eight layers. Typically, in particular the inner patterned electrically conductive layer structures have a comparatively thick copper thickness of e.g., 70 µm. This means that in between the conductor traces there are free spaces or voids. In order not to deteriorate the component carrier quality (e.g., the mechanic stability) the voids have to be filled during the lamination process. This can be realized by applying a high pressure. However, high pressure levels could easily induce an unwanted image transfer over a range of e.g., 100 µm along a thickness direction of the component carrier. In this context, an image transfer is a surface deformation at one surface of a dielectric layer structure caused by a surface deformation at the opposing other surface of the dielectric layer structure. Further, high pressure levels, in particular in combination with pronounced image transfers, may cause an unwanted warpage of the final component carrier. Thereby, every dielectric layer of a multilayer component carrier may make a contribution to such an unwanted warpage.

SUMMARY

Thus, there may be a need for a component carrier which exhibits only a small warpage.

This need may be met by the subject matter according to the independent claims. Advantageous embodiments of the present invention are described by the dependent claims.

According to a first aspect there is provided a component carrier, which comprises (a) a base structure having a main surface with a (three-dimensionally shaped) surface profile; (b) a first dielectric layer formed on the main surface of the base structure and having a first main surface with a (three-dimensionally shaped) first surface profile. The first main surface faces away from the main surface of the base structure and the first surface profile (with regard to its three-dimensional shape) corresponds to the surface profile of the base structure. The described component carrier further comprises (c) a second dielectric layer formed on the first main surface and having a second main surface with a (three-dimensionally shaped) second surface profile. The second main surface faces away from the main surface of the base structure and the second surface profile (with regard to its three-dimensional shape) differs from (does not correspond to) the surface profile of the base structure.

Overview of Embodiments

The described component carrier is based on the idea that by separating a dielectric layer, onto which later an electrically conductive layer or any other (multilayer) build-up structure can be formed, into two sub-layers, namely the first dielectric layer and the second dielectric layer, the flatness of the outer surface of the (combined) dielectric layer can be improved. This may hold true (i) for a spatially larger scale flatness which could be deteriorated by an unwanted warpage of the entire component carrier as well as (ii) for a spatially smaller scale flatness which could be deteriorated by unwanted elevations and indentations which may be caused by a so called "image transfer" during a lamination process. As has already been mentioned above in the introductory portion of this document, an image transfer is a surface deformation at one surface of a dielectric layer structure caused by a surface deformation at the opposing other surface of the dielectric layer structure because of pressure needed for any lamination process with (at least partially cured) dielectric layer structures, e.g., so called prepreg layer structures.

In order to achieve a maximum flatness of the outer surface of the described component carrier for the formation of each dielectric layer individual process parameters can be used. Specifically, for the formation of the first dielectric layer formed at the base structure a comparatively large pressure can be used. For the formation of the second dielectric layer formed at the first dielectric layer a smaller pressure can be used which may allow to "close" or smooth the image transfer resulting elevations and indentations at the outer surface of the first dielectric layer.

The described component carrier may exhibit the following advantages:

(1) The warpage of the entire component carrier will be extremely small.
(2) Voids within dielectric layers can be avoided.
(3) The component carrier can be used as a basis for forming at least one further high-quality build-up layer structure thereon. This may allow to produce a high quality thicker printed circuit board with a higher layer count.
(4) The component carrier allows to form electronic circuits with a high integration density.

According to an embodiment the base structure comprises a core and a stack. The stack includes at least one electrically conductive layer structure and/or at least one electrically insulating layer structure.

The core together with the stack may be a laminate, in particular formed by applying mechanical pressure and/or thermal energy. The term "layer structure" or simply "layer" may particularly denote a continuous layer, a patterned layer or a plurality of non-consecutive islands within a common plane.

The described component carrier, if applicable together with further build-up layers or build-up layer structures, may be shaped as a plate. This may contribute to a compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the at least one electrically insulating layer (structure) comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon is a registered mark of The Chemours Company FC, LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer (structure) comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

According to a further embodiment the stack comprises a patterned electrically conductive layer defining the main surface of the base structure, wherein the surface profile of the base structure is defined by the patterned electrically conductive layer.

In this embodiment the base structure provides at least one inner electrically conductive layer structure of a multi-layer component carrier. This allows to realize a high integration density for electronic assembly can be realized.

According to a further embodiment the patterned electrically conductive layer is a patterned metal layer, in particular a patterned copper layer. For forming the entire base structure usual PCB materials and PCB processing technologies can be used. Hence, the described component carrier can be manufactured in an effective manner by relying on well-established and approved manufacturing processes.

According to a further embodiment the component carrier further comprises an outer electrically conductive layer formed on the second dielectric layer. The outer electrically conductive layer can also be patterned in a suitable manner in order to form conductive traces and/or conductor pads for contacting (surface mounted) at least one electronic component.

According to a further embodiment the first dielectric layer has a first thickness and the second dielectric layer has a second thickness, wherein the first thickness is the same as the second thickness. This may allow to realize high quality results in particular with regard to warpage and flatness of the component carrier. In alternative embodiments, the first thickness is different from the second thickness.

According to a further embodiment at least one of the first dielectric layer and the second dielectric layer comprises resin and solid objects located within the resin.

The solid objects may have an effect on characteristic features of the respective dielectric layer such as the mechanical stability/rigidness, the flow behavior during a curing process (in particular during a lamination process), the dielectric constant, the impedance, etc. Hence, by selecting a proper amount, material and/or size of the solid objects, appropriate application specific properties of the entire component carrier realized.

According to a further embodiment the first dielectric layer comprises an inhomogeneous distribution of the solid objects across (or along) the first main surface. Alternatively or in combination, the second dielectric layer comprises a homogeneous distribution of the solid objects across (or along) the second main surface.

By selecting an appropriate inhomogeneous distribution of the solid objects within the first dielectric layer a generally even or flat first main surface already of the first dielectric layer can be realized (before forming the second dielectric layer thereon). This flatness may relate in particular to the above-mentioned larger scale flatness. An also unwanted smaller scale non-flatness, which could be caused by the above described "image transfer" during a lamination process, can be compensated by the second dielectric layer of the described component carrier.

It is pointed out that the solid objects are typically harder than the surrounding resin material. As a consequence, the compressibility of the first dielectric layer and/or the second dielectric layer depends on the number and area of solid objects being embedded within the resin material of the respective layer. Hence, by choosing an appropriate inhomogeneous distribution of the solid objects across the first dielectric layer one could specifically adapt the local compressibility of the first dielectric layer in view of the (expected) surface profile of the main surface of the base structure. Hence, there could be achieved already a significant surface flattening solely with the first dielectric layer.

The described homogeneous distribution of the solid objects across the second main surface may allow to improve the mentioned smaller scale flatness.

According to a further embodiment the solid objects are reinforcing fibers and/or filler particles. In PCB manufacturing technology both reinforcing fibers and filler particles such as glass spheres are proven and well-established materials in order to realize in an effective and reliable manner desired application specific characteristic features of the respective dielectric layer.

According to a further embodiment a variation of the thickness of the component carrier divided by an average thickness of the component carrier is less than 5%, in particular less than 3%.

A component carrier (as an intermediate product) with a precisely defined thickness facilitates almost any further processing of the component carrier in order to produce a high-quality printed circuit board, in particular a multilayer PCB. Further, the described small thickness variation has the effect of a stable impedance across the entire surface of the circuit board. Hence, a stable and reliable electronic circuit can be formed at the component carrier in order form an electronic assembly with an excellent behavior in particular for high-frequency (HF) applications.

According to a further embodiment the base structure has a further main surface with a (three-dimensionally shaped) further surface profile, wherein the further main surface is opposite to the main surface. The component carrier according to this embodiment further comprises (a) a third dielectric layer formed on the further main surface of the base structure and having a third main surface with a (three-dimensionally shaped) third surface profile. The third main surface faces away from the further main surface of the base structure and the third surface profile (with regard to its three-dimensional shape) corresponds to the further surface profile of the base structure. The described component carrier further comprises (b) a fourth dielectric layer formed on the third main surface and having a fourth main surface with a (three-dimensionally shaped) fourth surface profile. Thereby, the fourth main surface faces away from the further main surface of the base structure and the fourth surface profile (with regard to its three-dimensional shape) differs from (does not correspond to) the further surface profile of the base structure. This embodiment of a component carrier can be realized as a (fully) symmetric multilayer PCB which, due to its symmetry, may exhibit a superior behavior in particular with regard to a minimum warpage.

It is pointed out that this symmetry may not only relate to the dimension respectively the thickness of the dielectric layers but also to potential further build-up layer structures which may be formed at both opposing sides of the base structure. Further, the mentioned symmetry may also relate to the material and/or other characteristic features such as the mechanical stability/rigidness, the flow behavior during a curing process (in particular during a lamination process), the dielectric constant, the impedance, etc.

According to a further embodiment the component carrier comprises at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

According to a further embodiment the component carrier comprises at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene.

According to a further embodiment the component carrier comprises at least one of the dielectric layers and the electrically insulating layer structure comprises at least one of the group consisting of resin, in particular reinforced or non-reinforced resin, for instance epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide.

According to a further embodiment the component carrier is shaped as a plate.

According to a further embodiment the component carrier is configured as one of the group consisting of a printed circuit board, a substrate, and an interposer.

According to a further embodiment the component carrier is configured as a laminate-type component carrier.

According to a further aspect there is provided a method for manufacturing a component carrier. The provided method comprises (a) providing a base structure having a main surface; (b) pressing an at least partially uncured first dielectric layer together with an auxiliary sheet onto the main surface of the base structure; (c) removing the auxiliary sheet from the first dielectric layer; and (d) pressing an at least partially uncured second dielectric layer onto the first dielectric layer.

This aspect is based on the idea that a single press cycle, wherein a layer stack consisting of one metal layer and one (at least partially uncured) dielectric layer is laminated directly or indirectly onto or at a base structure, is subdivided into two sub-cycles. Thereby, each sub-cycle can be accomplished with specific and appropriate parameters for each sub-cycle. These parameters may include process parameters (e.g., pressure, temperature, etc.) as well as the layer specific parameters of the first dielectric layer, the auxiliary sheet, and the second dielectric layer (e.g., material, thickness, degree of curing, etc.).

The main target of the first press sub-cycle may be to ensure a good filling of the inner layers while minimizing the level of image transfer. Thereby, a comparatively high pressure may allow an entire filling of the inner first dielectric layers while the auxiliary sheet will act as a strong boundary condition to prevent excessive image transfer on the next outer second dielectric layer. Thereby, the image transfer might be limited to, e.g., 20 μm.

After the first press sub-cycle is accomplished, the auxiliary sheet may be removed in particular by means of etching away in order to prepare the corresponding intermediate product for the second press sub-cycle.

The main target of the second press sub-cycle is to get rid at least partially of all unwanted image transfer and to end up with a structure having no or only a negligible or nearly undetectable warpage. The thus formed semifinished product may be provided with a further outer electrically conductive layer which can be further processed in a known manner. This processing may include for instance an appropriate patterning in order to form outer conductor traces and/or outer conductor pads for contacting mounted electronic components.

The auxiliary sheet can be made from any material or material combination that is stiff enough to uniformly distribute the stress respectively the pressure which is applied on the stack comprising the base structure and the at least partially uncured first dielectric layer. Further, the material or the material combination should allow that the auxiliary sheet can be removed without or with only minor residues. The auxiliary sheet can also comprise a stack of different material layers.

According to a further embodiment the auxiliary sheet comprises at least one of the group consisting of a copper sheet, a ceramic sheet, and a glass sheet. The described materials for the auxiliary sheet are particular suitable for homogenizing the pressure acting on the first dielectric layer during a lamination process. Further, in particular copper but also the other mentioned materials may allow for any easy removal of the auxiliary sheet before forming/laminating the second dielectric layer onto the first dielectric layer. Furthermore, the described materials are well known materials for PCB manufacturing processes and facilitate a realization of the described method with known process equipment.

In some embodiments the auxiliary sheet comprises a (thin) copper foil which is applied or attached on a steel support structure. This attachment can be realized with a sticky material. The sticky material could be any adhesive layer, e.g., a glue layer and/or a sticky tape/foil.

According to a preferred embodiment the auxiliary sheet has a thickness of at least 50 μm and in particular at least 100 μm.

According to a further embodiment an outer electrically conductive layer is pressed together with the second dielectric layer onto the first dielectric layer. Thereby, the outer electrically conductive layer may be a copper structure, in particular having a thickness of less than 40 μm and further in particular having a thickness of less than 20 μm.

According to a further embodiment the base structure has a further main surface, wherein the further main surface is opposite to the main surface. The method according to this embodiment further comprises (a) pressing, simultaneously with the pressing of the at least partially uncured first dielectric layer, an at least partially uncured third dielectric layer together with a further auxiliary sheet onto the further main surface of the base structure; (b) removing the further auxiliary sheet from the third dielectric layer; and (c) pressing, simultaneously with the pressing of the at least partially uncured second dielectric layer, an at least partially uncured fourth dielectric layer onto the third dielectric layer.

The described method may provide the advantage that the resulting component carrier can be realized as a (fully) symmetric multilayer PCB. Advantages and possible further features of such a symmetric component carrier have already been described above and hold, mutatis mutandis also for the described (symmetric) method.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other noted, in addition to any combination of features belonging to one type of subject matter also any combination between features relating to different subject matters, in particular between features of the method type claims and features of the apparatus type claims is considered as to be disclosed with this document.

Before, referring to the drawings, exemplary embodiments will be described in further detail, some basic considerations will be summarized based on which exemplary embodiments of the invention have been developed.

In the context of the present document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier is configured as one of the group consisting of a printed circuit board, a substrate (in particular an IC substrate), and an interposer.

In the context of the present document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present document, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a PCB, however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

After having completed formation of a stack of electrically insulating layer structures and electrically conductive layer structures, it is possible to proceed with a surface treatment of the obtained layers structures or component carrier. In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

The described component carrier may be provided with at least one embedded component, which is accommodated at least partially within a recess formed in the component carrier structure. The at least one component can be selected from a group consisting of an electrically non-conductive inlay (such as a ceramic inlay or aluminum nitride inlay), an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

The aspects defined above and further aspects of the present technology are apparent from the examples of embodiment to be described hereinafter and are explained with reference to the examples of embodiment. The present technology will be described in more detail hereinafter with reference to examples of embodiment but to which the invention is not limited.

BRIEF DESCRIPTION OF THE DRAWINGS

FIG. 2A, FIG. 2B, FIG. 2C, FIG. 2D to FIG. 2E illustrate a method for manufacturing a component carrier in accordance with a further embodiment, wherein the component carrier comprises an intermediate multi-core layer stack having a plurality of inner cores and dielectric layers.

DETAILED DESCRIPTION OF ILLUSTRATED EMBODIMENTS

Figure 1A:
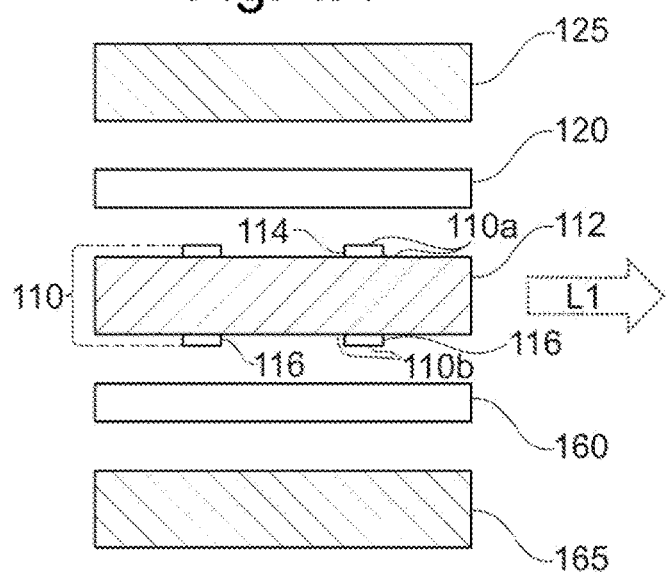
FIG. 1A, FIG. 1B, FIG. 1C, FIG. 1D to FIG. 1E illustrate a method for manufacturing a component carrier in accordance with an embodiment.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

FIG. 1A to FIG. 1E illustrate a method for manufacturing a component carrier 100 in accordance with an embodiment of the invention. The manufacturing method starts with preparing various layer structures for a first lamination process, wherein these layer structures are laminated together in a known manner by applying pressure and heat.

FIG. 1A shows the various layer structures before being arranged together. As can be taken from FIG. 1A, the layer structures are arranged in a symmetrical manner, wherein a base structure 110 is arranged in the middle of this symmetric arrangement. The basic structure 110 comprises a core 112 onto which there are formed two patterned electrically conductive layers 114 and 116. According to the exemplary embodiment described here the patterned electrically conductive layers 114 and 116 are made from copper.

A patterned electrically conductive layer 114 is formed at an upper surface of the base structure 110 and a further patterned electrically conductive layer 116 is formed at a lower surface of the base structure 110. Both patterned electrically conductive layers 116, 114 represent, within the final product/component carrier 100, inner conductor traces. Hence the final product is a multilayer component carrier 100.

Due to the thickness of the patterned electrically conductive layers 114, 116, the base structure 110 comprises, at an upper main surface 110a, a three-dimensional surface profile. Accordingly, the base structure 110 comprises, at a lower main surface 110b, a further three-dimensional surface profile.

Within the layered arrangement to be laminated there is further provided a first dielectric layer 120 above the base structure 110 and third dielectric layer 160 below the base structure 110. Further, as can be taken from FIG. 1A, above the first electric layer 120 there is provided an auxiliary sheet 125 and below the third electric layer 160 there is provided a further auxiliary sheet 165. According to the embodiment described here the two auxiliary sheets 125, 165 are relatively thick copper layers having a thickness of for instance 105 μm.

Figure 1B:
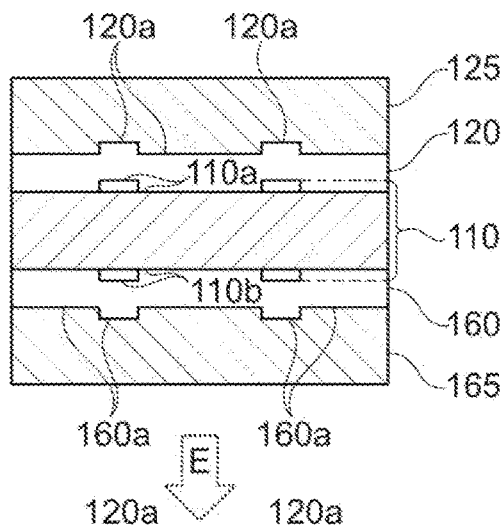

FIG. 1B shows the layer arrangement after the mentioned first lamination process, which is indicated by the arrow L1.

It can be seen that the lamination caused a so-called image transfer. This means that the three-dimensional surface profile 110a pushes through at least partially through the first electric layer 120. Hence, a first main surface 120a of the first electric layer 120 exhibits a three-dimensional first surface profile. Depending on the process conditions, in particular the pressure, which have been applied for the first lamination process L1, the height variations of the first surface profile 120a more or less correspond to the surface profile 110a. Of course, a corresponding further image transfer also occurs at the lower side of the base structure 110. This further image transfer generates, at a third main surface 160a of the third electric layer 160, a three-dimensional third surface profile, which at least basically corresponds to the further surface profile 110b.

In the next manufacturing step the (copper) auxiliary sheet 125 and the (copper) further auxiliary sheet 165 are removed by means of a known etching procedure. The result of this etching procedure, which is indicated with the arrow E, is shown in FIG. 1C.

Figures 1C, 1D, 1E:
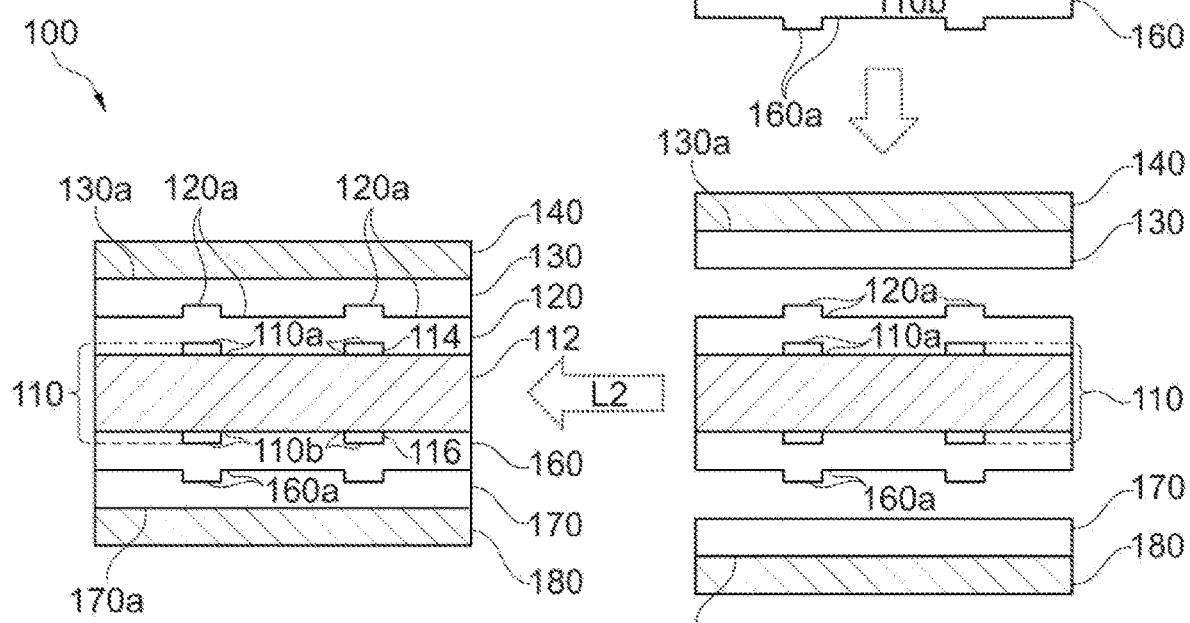

As can be seen from FIG. 1D, after the etching procedure E there are provided several further layers. This provisioning is indicated with a row P.

According to the exemplary embodiment described here, the several further layers include a first two-layer stack and a second two-layer stack. The first two-layer stack comprises a second electric layer 130 and an outer electrically conductive layer 140. The second two-layer stack comprises a fourth electric layer 170 and a further outer electrically conductive layer 180.

It is mentioned that the second dielectric layer 130 and the outer electrically conductive layer 140 can also be separate layers before being laminated together with the other layers. The same holds true also for the fourth dielectric layer 170 and the further outer electrically conductive layer 180.

Thereafter, a second lamination process, which is indicated by the arrow L2, is carried out. This second lamination process L2 yields the component carrier 100, which is shown in FIG. 1E.

Due to the pressure required for the second lamination process L2 there is again an image transfer, now from the three-dimensional first surface profile 120a to a three-dimensional second surface profile of the second main surface of the second dielectric layer 130. However, the process conditions of the first lamination process L1 and the second lamination process L2 and also the material properties of the layer structures involved in these lamination processes L1 and L2 are selected such that the height variations of the second surface profile 130a are signifi-cantly smaller than the height variations of the first surface profile 120a. According to the embodiment described here the height variations of the second surface profile 130a are so small that they can be neglected and, as a consequence, are not shown in FIG. 1E.

Due to the symmetric layer structure arrangement, it is clear that there occurs also a corresponding further image transfer at the lower side of the base structure 110. This further image transfer occurs between the third surface profile 160a and a fourth surface profile 170a at a fourth main surface of the fourth dielectric layer 170.

It is mentioned that the depicted component carrier 100 can of course also be further processed for instance to a printed circuit board (PCB), which is not shown in FIG. 1A to FIG. 1E. Such a further processing may include for instance an appropriate patterning of the outer electrically conductive layer 140 and/or of the further outer electrically conductive layer 180. Thereby, further conductor traces within the interior of the PCB can be formed. Further, such a processing could include a build-up with further layer structures in order to increase the layer count of the PCB.

FIG. 2A to FIG. 2E illustrate a method for manufacturing a component carrier 200 in accordance with a further embodiment of the invention.

The component carrier 200 comprises an intermediate multi-core layer stack 211. As can be seen from the exploded view of FIG. 2A, the intermediate multi core layer stack 211 comprises a multilayer stack including a plurality of cores 212 and a plurality of inner dielectric layers 215.

Specifically, the intermediate multi-core layer stack 211 comprises two (outer) dielectric layers, a first dielectric layer 220 and a third dielectric layer 260. The cores 212 on the one side and the dielectric layers 215, 220, 260 on the other side are arranged in an alternating sequence. The cores 212 and the dielectric layers 215, 220, 260 may be any appropriate layer structure, which are well known from PCB manufacturing. The inner dielectric layers 215 and/or the dielectric layers 220, 260 may be prepreg layer structures.

Further, on top of the upper core 212 (and below the first dielectric layer 220) there is provided a not depicted patterned electrically conductive layer, which corresponds to the patterned electrically conductive layer 114 of FIG. 1A. Accordingly, below the lower core 212 (and above the third dielectric layer 260) there is provided a not depicted further patterned electrically conductive layer, which corresponds to the further patterned electrically conductive layer 116 of FIG. 1A.

As can be further seen from FIG. 2B, above the intermediate multi-core layer stack 211 there is provided an auxiliary sheet 225. Below the intermediate multi-core layer stack 211 there is provided a further auxiliary sheet 265. Again, these auxiliary sheets 225 and 265 may be copper foils having for instance 105 μm.

FIG. 2B shows the result of a first lamination procedure L1. Thereby, with appropriate lamination process conditions the auxiliary sheets 225, 265 and in particular the first dielectric layer 220 as well as the third dielectric layer 260 are attached to the other layer structures of the intermediate multi-core layer stack 211.

Thereafter, the two auxiliary sheets 225 and 265 are removed by an appropriate and per se well known etching process E. The resulting intermediate product is shown in FIG. 2C.

The manufacturing method continues with providing further layer structures. In accordance with the method illustrated in FIG. 2A to FIG. 2E, a second electric layer 230 is provided over the intermediate multi-core layer stack 211 and an outer electrically conductive layer 240 is provided over the second electric layer 230. Accordingly, a fourth dielectric layer 270 is provided below the intermediate multi-core layer stack 211 and a further outer electrically conductive layer 280 is provided below the fourth dielectric layer 270. This is shown in FIG. 2D.

Thereafter, a second lamination process L2 is carried out. This second lamination process L2 yields the component carrier 200, which is shown in FIG. 2E. In the described component carrier 200 elevations and/or indentations caused by image transfer effects become smaller and smaller with each further formed (outer) dielectric layer of the multilayer component carrier 200.

It should be noted that the term "comprising" does not exclude other elements or steps and the use of articles "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

LIST OF REFERENCE SIGNS

100 component carrier
110 base structure
110*a* main surface/surface profile
110*b* further main surface/further surface profile
112 core
114 patterned electrically conductive layer
116 further patterned electrically conductive layer
120 first dielectric layer
120*a* first main surface/first surface profile
125 auxiliary sheet
130 second dielectric layer
130*a* second main surface/second surface profile
140 outer electrically conductive layer
160 third dielectric layer
160*a* third main surface/third surface profile
165 further auxiliary sheet
170 fourth dielectric layer
170*a* fourth main surface/fourth surface profile
180 further outer electrically conductive layer
L1 first lamination process
E etching process
P provisioning further layer structures
L2 second lamination process
200 component carrier
211 intermediate multi-core layer stack
212 cores
215 inner dielectric layers/prepreg layers
220 first dielectric layer
225 auxiliary sheet
230 second dielectric layer
240 outer electrically conductive layer
260 third dielectric layer
265 further auxiliary sheet
270 fourth dielectric layer
280 further outer electrically conductive layer

The invention claimed is:

1. A component carrier, comprising:
   a base structure having a main surface with a surface profile;
   a first dielectric layer formed on the main surface of the base structure and having a first main surface with a first surface profile,
   wherein the first main surface faces away from the main surface of the base structure, and
   wherein the first surface profile corresponds to the surface profile of the base structure; and
   a second dielectric layer formed on the first main surface and having a second main surface with a second surface profile,
   wherein the second main surface faces away from the main surface of the base structure, and
   wherein the second surface profile differs from the surface profile of the base structure;
   wherein first process conditions of a first lamination process and second process conditions of a second lamination process are selected such that height variations of the second surface profile are significantly smaller than respective height variations of the first surface profile.

2. The component carrier as set forth in claim 1, wherein the base structure comprises a core and a stack including at least one electrically conductive layer structure and/or at least one electrically insulating layer structure.

3. The component carrier as set forth in claim 2, wherein the stack comprises a patterned electrically conductive layer defining the main surface of the base structure, wherein the surface profile of the base structure is defined by the patterned electrically conductive layer.

4. The component carrier as set forth in claim 3, wherein the patterned electrically conductive layer is a patterned metal layer.

5. The component carrier as set forth in claim 1, further comprising:
   an outer electrically conductive layer formed on the second dielectric layer.

6. The component carrier as set forth in claim 1, wherein the first dielectric layer has a first thickness and the second dielectric layer has a second thickness, wherein the first thickness is the same as the second thickness or wherein the first thickness is different from the second thickness.

7. The component carrier as set forth in claim 1, wherein at least one of the first dielectric layer and the second dielectric layer comprises resin and solid objects located within the resin.

8. The component carrier as set forth in claim 7, wherein the first dielectric layer comprises an inhomogeneous distribution of the solid objects across the first main surface and/or wherein the second dielectric layer comprises a homogeneous distribution of the solid objects across the second main surface.

9. The component carrier as set forth in claim 7, wherein the solid objects are reinforcing fibers and/or filler particles.

10. The component carrier as set forth in claim 1, wherein a variation of the thickness of the component carrier divided by an average thickness of the component carrier is less than 5%.

11. The component carrier as set forth in claim 1, wherein the base structure has a further main surface with a further surface profile, wherein the further main surface is opposite to the main surface;
   the component carrier further comprising:
      a third dielectric layer formed on the further main surface of the base structure and having a third main surface with a third surface profile,
      wherein the third main surface faces away from the further main surface of the base structure, and wherein the third surface profile corresponds to the further surface profile of the base structure; and a fourth dielectric layer formed on the third main surface and having a fourth main surface with a fourth surface profile, wherein the fourth main surface faces away from the further main surface of the base structure, and wherein the fourth surface profile differs from the further surface profile of the base structure.

12. A method for manufacturing a component carrier, the method comprising:

providing a base structure having a main surface;

pressing an at least partially uncured first dielectric layer together with an auxiliary sheet onto the main surface of the base structure;

removing the auxiliary sheet from the first dielectric layer; and pressing an at least partially uncured second dielectric layer onto the first dielectric layer;

wherein first process conditions of a first lamination process and second process conditions of a second lamination process are selected such that height variations of the second surface profile are significantly smaller than respective height variations of the first surface profile.

13. The method as set forth in claim 12, wherein the auxiliary sheet comprises at least one of the group consisting of a copper sheet, a ceramic sheet, and a glass sheet.

14. The method as set forth in claim 12, wherein an outer electrically conductive layer is pressed together with the second dielectric layer onto the first dielectric layer.

15. The method as set forth in claim 14, wherein the outer electrically conductive layer is a copper structure.

16. The method as set forth in claim 15, wherein the copper structure has a thickness of less than 40 μm.

17. The method as set forth in claim 12, wherein the base structure has a further main surface, wherein the further main surface is opposite to the main surface;

the method further comprising:

pressing, simultaneously with the pressing of the at least partially uncured first dielectric layer, an at least partially uncured third dielectric layer together with a further auxiliary sheet onto the further main surface of the base structure;

removing the further auxiliary sheet from the third dielectric layer; and pressing, simultaneously with the pressing of the at least partially uncured second dielectric layer, an at least partially uncured fourth dielectric layer onto the third dielectric layer.

* * * * *